United States Patent
Trombetti

(10) Patent No.: US 9,316,680 B2
(45) Date of Patent: Apr. 19, 2016

(54) METHOD, DEVICE AND CIRCUITRY FOR DETECTING A FAILURE ON A DIFFERENTIAL BUS

(71) Applicant: Infineon Technologies AG, Neubiberg (DE)

(72) Inventor: Daniela Trombetti, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 77 days.

(21) Appl. No.: 13/936,161

(22) Filed: Jul. 6, 2013

(65) Prior Publication Data

US 2015/0009598 A1    Jan. 8, 2015

(51) Int. Cl.
*G01R 31/08* (2006.01)
*G06F 13/38* (2006.01)
*G06F 11/22* (2006.01)

(52) U.S. Cl.
CPC .............. *G01R 31/08* (2013.01); *G06F 11/221* (2013.01); *G06F 13/38* (2013.01)

(58) Field of Classification Search
CPC ......................................................... G01R 31/08
USPC ............................................................. 361/86
See application file for complete search history.

(56) References Cited

U.S. PATENT DOCUMENTS

2009/0033345 A1* 2/2009 Picard et al. ................... 324/705
2012/0283910 A1* 11/2012 Lee et al. ......................... 701/41

FOREIGN PATENT DOCUMENTS

| CN | 2657297 | 11/2004 |
| CN | 101458528 A | 6/2009 |
| JP | 2007244138 A | 9/2007 |

* cited by examiner

*Primary Examiner* — Scott Bauer
(74) *Attorney, Agent, or Firm* — SpryIP, LLC

(57) ABSTRACT

An exemplary embodiment relates to a method for detecting a failure on a differential bus. The method may include: determining an allowed voltage range of the differential bus based on a minimum load and a maximum load; comparing a differential bus voltage with the allowed voltage range; and determining a failure state in case the differential bus voltage is outside the allowed voltage range.

30 Claims, 13 Drawing Sheets

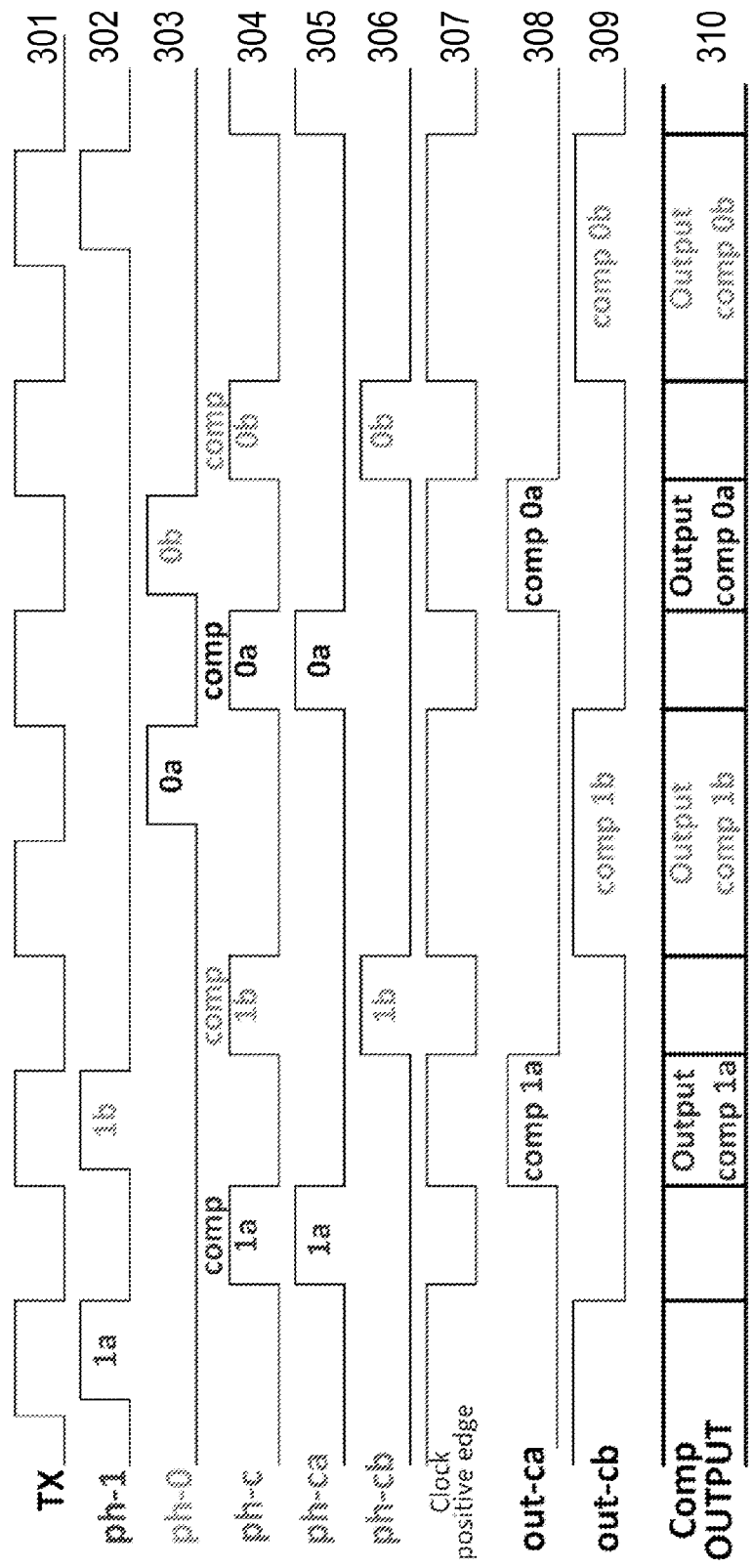

Fig.14

| | | 1405 | 1406 | 1407 | 1408 |
|---|---|---|---|---|---|
| | Failure Type | $V_{TX1}<R_{MIN}i_{DM1}$ | $V_{TX1}>R_{MAX}i_{DM1}$ | $V_{TX0}>R_{MIN}i_{DM0}$ ($\|V_{TX0}\|<R_{MIN}\|i_{DM0}\|$) | $V_{TX0}<R_{MAX}i_{DM0}$ ($\|V_{TX0}\|>R_{MAX}\|i_{DM0}\|$) |
| 1401 | Broken wire/wires | n | y | n | y |
| 1402 | Bus wires are short circuited with each other | y | n | y | n |
| 1403 | BP to GND BM to $V_{CC}$ or $V_{BAT}$ | y | n | n | y |
| 1404 | BP to $V_{CC}$ or $V_{BAT}$ BM to GND | n | y | y | n |
| | | n | n | y | n |
| | | n | y | n | n | y: failure condition is satisfied
n: failure condition is not satisfied

US 9,316,680 B2

METHOD, DEVICE AND CIRCUITRY FOR DETECTING A FAILURE ON A DIFFERENTIAL BUS

BACKGROUND OF THE INVENTION

The detection of a failure in high speed networks can represent a complicated task due to the high variability of the network parameters, ground shift, common mode choke (CMC) effects as well as external disturbances.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

FIG. 3 shows a logic diagram comprising several signals of the schematic diagram according to FIG. 2;

FIG. 14 shows an exemplary table summarizing several failure types in relation to the fulfilled (or not fulfilled) failure conditions (comparisons).

DETAILED DESCRIPTION OF THE PREFERRED EMBODIMENTS

Figure 1:
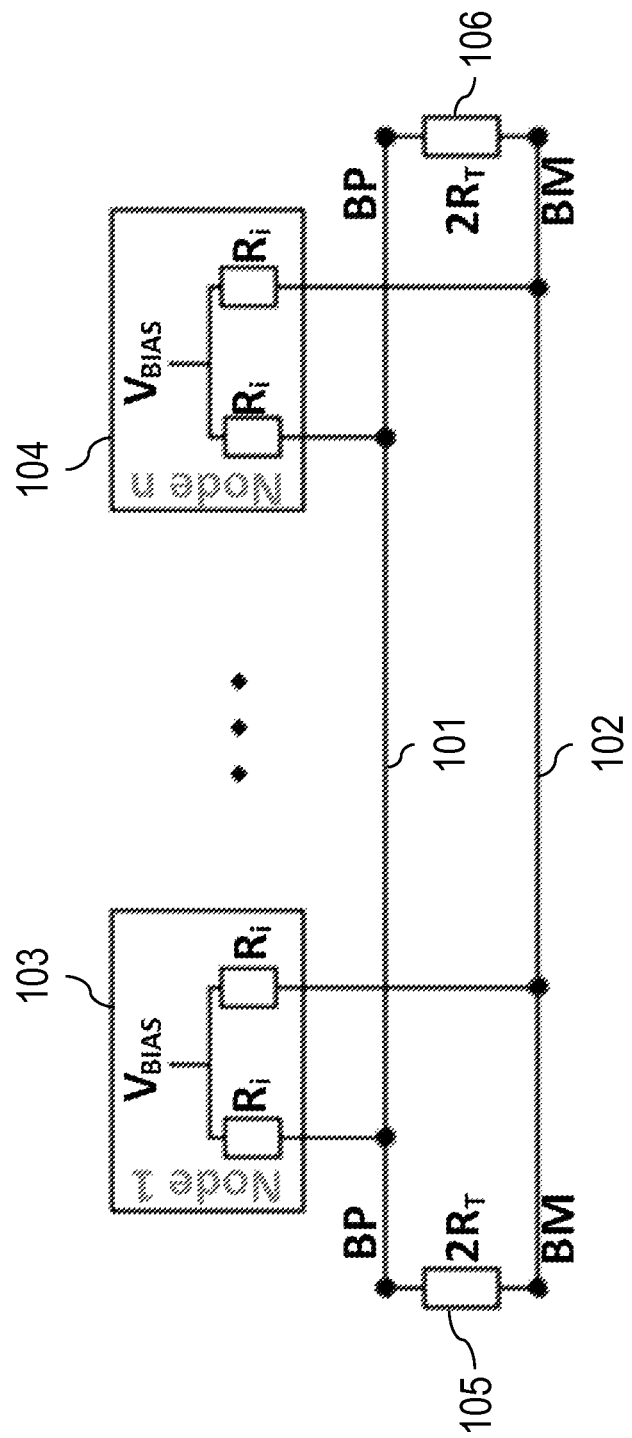
FIG. 1 shows a schematic of a FlexRay network.

A first embodiment relates to a method for detecting a failure on a differential bus comprising the steps:

determining an allowed voltage range of the differential bus based on a minimum load and a maximum load;
  comparing a differential bus voltage with the allowed voltage range;
  determining a failure state in case the differential bus voltage is outside the allowed voltage range.

A second embodiment relates to a device for detecting a failure on a differential bus, wherein said device comprises a processing unit arranged for determining an allowed voltage range of the differential bus based on a minimum load and a maximum load;
  comparing a differential bus voltage with the allowed voltage range;
  determining a failure state in case the differential bus voltage is outside the allowed voltage range.

A third embodiment relates to a device for detecting a failure on a differential bus, said device comprising means for determining an allowed voltage range of the differential bus based on a minimum load and a maximum load;
  means for comparing a differential bus voltage with the allowed voltage range;
  means for determining a failure state in case the differential bus voltage is outside the allowed voltage range.

A forth embodiment is directed to a circuitry for detecting a failure on a differential bus, the differential bus comprising a first bus wire and a second bus wire, comprising:

a memory for storing a differential bus voltage between the first bus wire and the second bus wire,
  a unit that provides an allowed voltage range based on a minimum load and based on a maximum load,
  a comparator unit for comparing the differential bus voltage stored in the memory with the allowed voltage range,
  a switching unit for
    connecting during a loading phase the bus wires to the memory;
    connecting during a comparison phase the memory and the unit that provides the allowed voltage range to the comparator unit,
  wherein the comparator unit detects the failure in case the differential bus voltage is outside the allowed voltage range.

A fifth embodiment relates to a system comprising at least one device as described herein.

The examples in particular refer to a detection of (e.g., physical) bus failures in a differential data-bus environment, e.g., network, in which differential mode data may be used for data transmission purposes. An exemplary differential bus system utilizes the FlexRay protocol. For details on the FlexRay protocol, reference is made to http://en.wikipedia.org/wiki/FlexRay. Another example is a CAN bus (see also, e.g., http://en.wikipedia.org/wiki/Controller_area_network).

The approach is in particular useful utilizing a differential bus that is able of symmetrical transmission. Such bus could be based on, e.g., the FlexRay protocol.

For example, in a CAN system, a differential mode (DM) load $R_{LOAD}$ allowed may be in a range between 50Ω and 65Ω; in a FlexRay system the DM load $R_{LOAD}$ may be in a range between 40Ω and 55Ω. However, different amounts or ranges may be applicable for systems mentioned or for other systems as well.

A failure that is subject to detection may be at least one of the following:

a broken bus wire (e.g., one or both wires of the bus are broken);

bus wires that are short-circuited with each other (with or without an additional short circuit to a fixed voltage);
one wire of the bus is short-circuited, e.g., to ground (GND), to a supply voltage ($V_{CC}$) or to a battery voltage ($V_{BAT}$).

The examples described herein may be applied to various use cases, in particular in the automotive environment, e.g., bus systems that are operated in a vehicle.

A range of the (total) DM load of a FlexRay or CAN system may be pre-defined, e.g., according to an EPL specification (EPL: Electrical Physical Layer). This range of the DM load is also referred to herein as "DM load requirement".

The DM load requirement can be used to detect physical failures on data-bus wires. A failure may be indicated, e.g., flagged, when an "equivalent DM load" for a transmitter (i.e., $V_{DM}/I_{DM}$, a DM voltage on the bus over a DM current generated) does not satisfy the DM load requirement.

One example for the solution presented may be a FlexRay system or network, which will be explained hereinafter. The solution, however, is not restricted to the FlexRay scenario, it could be applied to any other DM system, in particular a CAN network.

FIG. 1 shows a schematic of a FlexRay network comprising bus wires 101 and 102, a first network node 103 and a second network node 104. More than two network nodes may be connected to the bus wires 101 and 102. Each network node 103, 104 comprises a transmitter and a receiver (which may in combination also be referred to as "transceiver") for conveying data across the bus wires 101, 102 and for receiving data via the bus wires 101, 102. At both ends of the bus, the bus wires 101, 102 are connected via terminating resistors 105 and 106 (each of such resistors also referred to as "termination").

Broken Wire(s):

High frequency networks are often terminated with two equal DM impedances that are connected substantially in parallel to each other. Each termination may be connected to one end of the (data) bus in order to avoid reflections. In case of one or both broken bus wires the network is divided into two sub-networks. The two sub-networks continue working substantially independently from each other over one of the two terminations. The equivalent DM load affecting a transmitting node is twice the load of the error-free case. Such DM load may be between 100Ω and 130Ω for CAN and between 80Ω and 110Ω for FlexRay. Hence, the failure of broken wire(s) can be detected.

Bus Wires Short Circuited with Each Other:

In this case, the DM load is very low and tends to zero, which allows detecting this type of failure.

One Bus Wire Short Circuited to Ground:

The network symmetry (at $V_{CC}/2$) between the high and the low side is disordered. A high common mode (CM) current is generated and flows through the terminations into ground. Such high CM current generates a differential mode voltage component, which adds to the ordinary one generated by the DM current. The effective DM bus load affecting the transmitter ($V_{DM}/I_{DM}$: DM voltage on the bus over DM current generated) does not satisfy the DM load requirements.

Failure Detection:

A failure may thus be detected during data transmission based on a predetermined "on-line" allowed range for the DM voltage on the bus and comparing the effective voltage on the bus with this allowed range.

The allowed DM voltage range may be derived from measured high and low side currents in an output stage of the transmitter as follows:

(1) during a signal Data_1:

$$R_{MIN} \cdot i_{DM1} < V_{TX1allowed} < R_{MAX} \cdot i_{DM1}$$

with:
$i_{DM1}$ being an effective (in particular measured) DM current during the signal Data_1;
$R_{MIN}$ being a predetermined (e.g., by a specification) minimum load;
$R_{MAX}$ being a predetermined (e.g., by a specification) maximum load; and
$V_{TX1allowed}$ being the allowed DM voltage at the receiver of the transmitting node during the signal Data_1.

(2) during a signal Data_0:

$$R_{MAX} \cdot i_{DM0} > V_{TX0allowed} > R_{MIN} \cdot i_{DM0}$$

with
$i_{DM0}$ being an effective (in particular measured) DM negative current during the signal Data_0; and
$V_{TX0allowed}$ being the allowed DM negative voltage at the receiver of the transmitting node during the signal Data_0.

The solution presented in particular allows comparing a differential mode voltage on a bus (also referred to as DM bus voltage) during a signal "Data_1" (VTX1) and/or a signal "Data_0" (VTX0) with an allowed DM bus voltage range, e.g., defined starting from the DM current flowing in the considered transceiver. Data_1 may indicate a signal corresponding to logic "1" and Data_0 may indicate a signal corresponding to logic "0". Both, Data_0 and Data_1 are differential signals that may be used to encode a single bit of information on a differential bus system.

The DM currents ($i_{DM1}$ and $i_{DM0}$) may be positive exiting from a positive bus wire (BP) and entering a negative bus wire (BM)—or exiting CANH ("H" corresponds to "high" potential) and entering CANL ("L" corresponds to "low" potential) in case of a CAN system. The DM current may thus be defined as follows:

$$i_{DM} = \frac{i_{BP} - i_{BM}}{2} \text{ for } FlexRay; \text{ or}$$

$$i_{DM} = \frac{i_{CANH} - i_{CANL}}{2} \text{ for } CAN.$$

The currents $i_{BP}$, $i_{BM}$ or $i_{CANH}$ and $i_{CANL}$ may be considered positive when exiting a pin and negative when entering a pin.

The load $R_{MIN}$ and the load $R_{MAX}$ are the minimum and maximum DM load allowed, e.g., based on requirements and/or specifications.

The differential voltage on the bus during the signal Data_1 and the signal Data_0 is compared with the respective allowed DM voltage range. In case of a short circuited bus wire, both the allowed ranges and the differential voltages on the bus depend on the effective voltage at which the bus wire is short-circuited. Usually, the bus wire may be short-circuited to ground, supply voltage or battery voltage. However, due to a ground shift between a node 1 (transmitter) and a node 2 (receiver), if the wire is short-circuited at node 2 to ground, node 1 will see a short circuit to a voltage equal to a ground shift between both nodes.

In the dynamic case the allowed ranges and the differential voltages on the bus may depend on the duty cycle of the transmission due to the long time constant of a common mode choke (CMC). A failure may be detected as long as at least one differential voltage on the bus (i.e., the signal Data_1 and/or the signal Data_0) does not meet the respective allowed range.

Hence, in particular at least one of the following steps may be conducted:

(a) Currents in active branches of the output stage of the transmitter are measured and used to define the actual allowed range for the DM voltage on the bus, depending on the transmitting signal during the signal Data_1

$$R_{MIN} \cdot i_{DM1} < V_{TX1allowed} < R_{MAX} \cdot i_{DM1}$$

and during the signal Data_0

$$R_{MAX} \cdot i_{DM0} < V_{TX0allowed} < R_{MIN} \cdot i_{DM0}.$$

(b) The voltage $V_{TX1}$, $V_{TX0}$ on the bus is compared with the allowed DM voltage range just calculated, i.e. two comparisons for each data can be conducted:

for Data_1:

$$V_{TX1} < R_{MIN} \cdot i_{DM1} = V_{MIN1}$$

$$V_{TX1} > R_{MAX} \cdot i_{DM1} = V_{MAX1}$$

for Data_0:

$$V_{TX0} > R_{MIN} \cdot i_{DM0} = -V_{MIN0}$$

$$V_{TX0} < R_{MAX} \cdot i_{DM0} = -V_{MAX0}$$

The comparison operations may be performed simultaneously using two comparators, or during subsequent periods of the signal data. In the latter example, a single comparator may suffice.

(c) A failure-state is flagged, if at least one failure condition is satisfied.

The failure-state may be updated after each comparison or after each comparison-cycle (wherein each such comparison cycle may comprise four comparisons). Advantageously, all four comparisons may be considered to determine whether or not a failure occurred (or whether a failure state is reached).

(d) Processing the failure conditions, providing information about the type of failure. In particular, this step (d) may be optional.

Based on the failure state, a predefined action can be triggered, e.g., an alarm notification can be issued, a mode change of the device may occur, or a safe state can be entered. Also, a maintenance action can be initiated based on the failure state. It is also an option to wait for a predefined number of failures until flagging an error. This may in particular part of a maintenance action.

Figure 2:
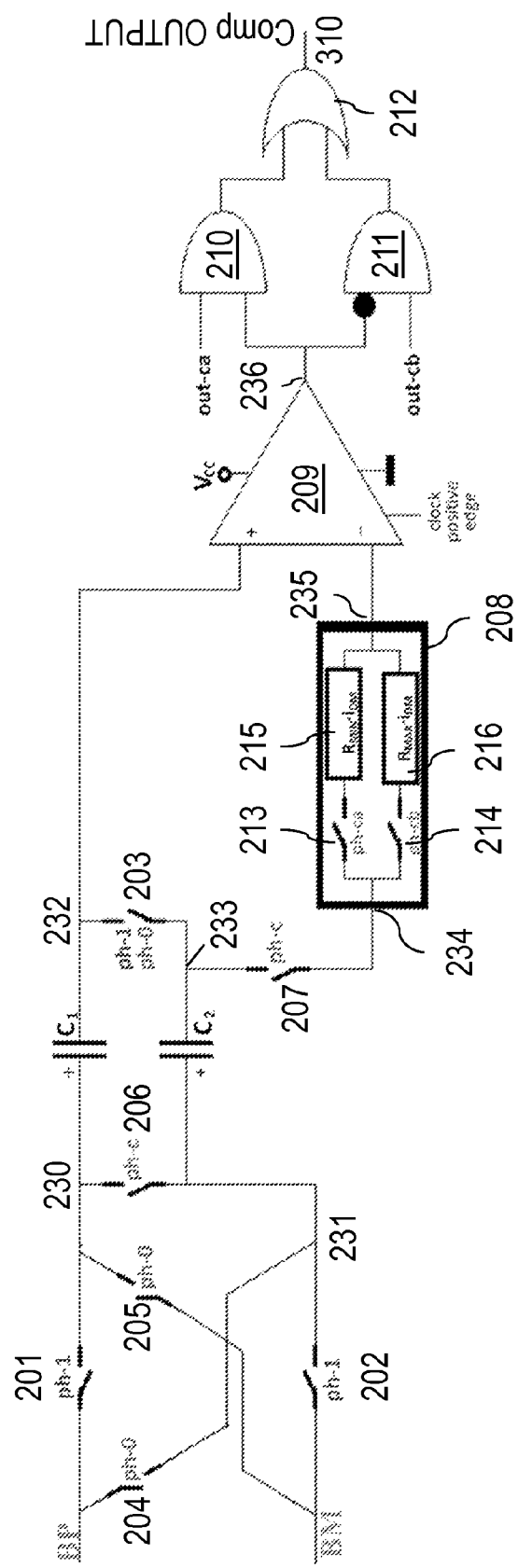
FIG. 2 shows a schematic concept of the failure detection circuit comprising a switching network, a reference generator and a comparator together with logic circuitry to determine a failure condition.

The approach described herein can be further illustrated with regard to FIG. 2 showing a schematic diagram of a schematic concept of the failure detection circuit. As stated above, the approach may also be applicable with other transceivers like, e.g., CAN transceivers.

A differential bus comprises a positive bus wire BP and a negative bus wire BM.

The positive bus wire BP is connected via a switch 201 to a node 230 and via a switch 204 to a node 231. The negative bus wire BM is connected via a switch 202 to the node 231 and via a switch 205 to the node 230. The node 230 and the node 231 are connected via a switch 206. The node 230 is connected via a capacitor C1 to a node 232 and the node 231 is connected via a capacitor C2 to a node 233. The node 232 and the node 233 are connected via a switch 203. The node 232 is connected to a non-inverting terminal of a comparator unit 209. The node 233 is connected via a switch 207 to a terminal 234 of a reference generator 208, wherein a terminal 235 (output) of the reference generator 208 is connected to the inverting terminal of the comparator unit 209.

The reference generator 208 comprises two switches 213 and 214 and two reference voltage sources 215 and 216. The terminal 234 is connected via the switch 213 and the voltage source 215 to the terminal 235; also, the terminal 234 is connected via the switch 214 and the voltage source 216 to the terminal 235.

The output 236 of the comparator unit 209 is connected to a first input of an AND gate 210 and an inverted output 236 is connected to a first input of an AND gate 211. A signal out-ca is supplied to the second input of the AND gate 210 and a signal out-cb is supplied to the second input of the AND gate 211. The output of the AND gate 210 is fed to the first input of an OR gate 212 and the output of the AND gate 211 is fed to the second input of the OR gate 212. The output of the OR gate 212 supplies a signal Comp OUTPUT 310.

The switches described herein can be electronic switches, e.g., transmission gates, transistors, in particular MOSFETs, that may be controlled by a control unit applying the different phases as described herein. It is noted that a switch mentioned herein may have a high impedance when being switched off and a low impedance when being switched on.

FIG. 3 shows a logic diagram comprising several signals of the schematic diagram according to FIG. 2. A transmission signal TX 301 is exemplarily taken as a basis for generating the subsequent signals. The signals generated may preferably avoid any overlapping in order not to deteriorate the sampled signals across the capacitors and in order not to short-circuit the bus wires BP and BM.

The phase1 ph-1 is indicated as a signal 302 and the phase0 ph-0 is visualized as a signal 303. The comparison phase ph-c is shown as a signal 304 combining a comparison phase ph-ca signal 305 and a comparison phase ph-cb signal 306, wherein the signal 305 is based on the switch 213 being on and the switch 214 being off and wherein the signal 306 is based on the switch 213 being off and the switch 214 being on.

A signal 307 indicates a clock positive-edge signal that is applied to the comparator unit 209. The signal out-ca 308 is applied to the AND gate 210 and the signal out-cb 309 is applied to the AND gate 211 as described above. The signal Comp OUTPUT 310 shows the signal at the output of the OR gate 212. The signals 308 and 309 are used for processing the output 236 of the comparator unit 209.

A phase1 (ph-1) is associated with the switches 201, 202 and 203, a phase0 (ph-0) is associated with the switches 204, 205 and 203. A comparison phase ph-c is associated with the switches 206, 207, 213 and 214. It is noted that the switch 213 is associated to the phase ph-ca (which is a sub-phase of the comparison phase ph-c) and the switch 214 is associated to the phase ph-cb (which is another sub-phase of the comparison phase ph-c).

During the phase1 and during the phase0, a differential mode (DM) voltage on the bus $V_{TX}=V_{BP}-V_{BM}$ (or a defined fraction of it amounting to $p \cdot V_{TX}$) is saved to the capacitors C1 and C2, i.e.

$$V_{C1}-V_{C2}=\text{Data\_1 during phase1 (ph-1) and}$$

$$V_{C1}-V_{C2}=-\text{Data\_0 during phase0 (ph-0).}$$

During the comparison phase ph-c, the voltage $V_{C1}-V_{C2}$ saved is compared with a reference voltage $V_{REF}$ provided by the reference generator 208. The reference voltage $V_{REF}$ may be defined based on a DM current $i_{DM}$ flowing in the output stage of the transmitter when the DM voltage $V_{TX}$ was saved in C1 and C2. The reference generator 208 supplies a minimum voltage $V_{MIN}$ via the voltage source 215 and the switch 213 or a maximum voltage $V_{MAX}$ via the voltage source 216 and the switch 214. The switches 213 and 214 may be alternately operated to compare the saved voltage ($V_{C1}-V_{C2}$) with the voltage $V_{MAX}$ and with the voltage $V_{MIN}$. If the saved voltage ($V_{C1}$-$V_{C2}$) does not fit into this range, a failure can be indicated.

In particular, two different failure conditions may be defined for each data, i.e. for Data_1 and for Data_0 (resulting in a total of four comparisons):

(1) A comparison "comp 1a" for Data_1:

$$V_{TX1} < R_{MIN} \cdot i_{DM1} = V_{MIN1}$$

(2) A comparison "comp 1b" for Data_1:

$$V_{TX1} > R_{MAX} \cdot i_{DM1} = V_{MAX1}$$

(3) A comparison "comp 0a" for Data_0:

$$-V_{TX0} < -R_{MIN} \cdot i_{DM0} = V_{MIN0}$$

(4) A comparison "comp 0b" for Data_0:

$$-V_{TX0} > -R_{MAX} \cdot i_{DM0} = V_{MAX0}$$

The resistors $R_{MIN}$ and $R_{MAX}$ may in particular determine the minimum and maximum DM bus load allowed on the bus (optionally including a pre-defined tolerance, due to, e.g., non-ideal behavior of the circuit in order to avoid compromising the comparisons), if the total DM voltage $V_{TX}$ is saved in the capacitor C1 and/or the capacitor C2;

As an option, the resistors $R_{MIN}$ and $R_{MAX}$ may determine a fraction p of the minimum and maximum DM load allowed on the bus (optionally including a pre-defined tolerance), if the total DM voltage $V_{TX}$ on the bus is scaled (p·$V_{TX}$) before being stored in the capacitor C1 and/or the capacitor C2. For example, in case a voltage divider is used between the bus wires and a failure detection circuit, the resistances $R_{MIN}$ and $R_{MAX}$ may be used to scale the admissible voltage range.

Figure 5:
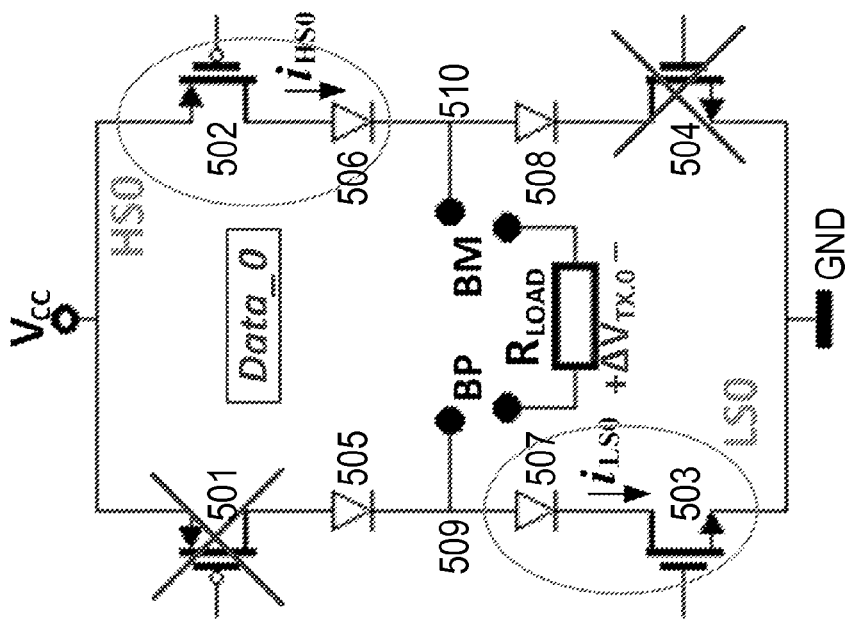
FIG. 5 shows the FlexRay transmitter of FIG. 4 during transmission of a signal Data_0.
Figure 4:
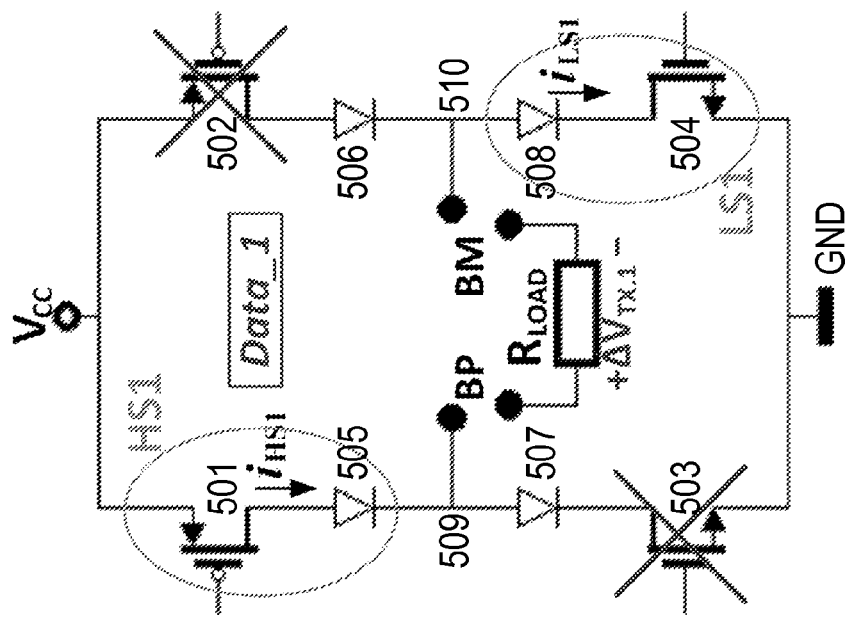
FIG. 4 shows a schematic circuit diagram of a FlexRay transmitter during transmission of a signal Data_1.

The currents $i_{DM1}$ and $i_{DM0}$ may correspond to effective DM currents in the output stage of the transmitter (see also above), i.e.

$$i_{DM1} = \frac{i_{HS1} + i_{LS1}}{2}$$

and $$i_{DM0} = -\frac{i_{HS0} + i_{LS0}}{2},$$

wherein the currents $i_{HS}$ and $i_{LS}$ are considered positive as in FIG. 4 and in FIG. 5 and wherein $i_{HS1}$ is the high side current during the Phase1 (corresponding to signal Data_1);
$i_{LS1}$ is the low side current during the Phase1 (corresponding to signal Data_1);
$i_{HS0}$ is the high side current during the Phase0 (corresponding to signal Data_0);
$i_{LS0}$ is the low side current during the Phase0 (corresponding to signal Data_0).

FIG. 4 shows a schematic circuit diagram of a FlexRay transmitter during transmission of a signal Data_1 and FIG. 5 shows the FlexRay transmitter during transmission of a signal Data_0.

A voltage source $V_{CC}$ is connected via a high side switch 501 and a diode 505 to a node 509. The node 509 is connected via a diode 507 and a low side switch 503 to ground GND. The voltage source $V_{CC}$ is also connected via a high side switch 502 and a diode 506 to a node 510. The node 510 is connected via a diode 508 and a low side switch 504 to ground GND. The node 509 is connected to the bus wire BP and the node 510 is connected to the bus wire BM. The bus has a load $R_{LOAD}$, which is (symbolically) connected to the nodes 509 and 510, i.e. connected to the bus wires BP and BM.

Each of the switches 501 to 504 may have a high impedance when being switched off and it may show some resistance in its on state, e.g., amounting to a range between 20Ω and 90Ω.

The diodes 505 to 508 are arranged such that the respective cathode points towards ground GND.

The switches 501 and 502 are p-channel MOSFETs, wherein the source is connected to the voltage source $V_{CC}$ and the drain is connected to the anode of the respective diode 505, 506. The switches 503 and 504 are n-channel MOSFETs, wherein the source is connected to ground GND and the drain is connected to the cathode of the respective diode 507, 508.

The signal Data_0 is conveyed (see FIG. 5) by activating the switches 502 and 503, wherein a current $i_{HS0}$ flows through the switch 502 and a current $i_{LS0}$ flows through the switch 503. This results in a voltage $V_{TX-0}$ between the nodes 509 and 510.

The signal Data_1 is conveyed (see FIG. 4) by activating the switches 501 and 504, wherein a current $i_{HS1}$ flows through the switch 501 and a current $i_{LS1}$ flows through the switch 504. This results in a voltage $V_{TX-1}$ between the nodes 509 and 510.

Hence, the output stage of the FlexRay transmitter according to FIG. 4 and FIG. 5 comprises two push-pull branches supplied by the voltage source $V_{CC}$. Two opposite signals ($V_{TX-1}$ for Data_1 and $V_{TX-0}$ for Data_0) are generated across the bus load $R_{LOAD}$, wherein the total bus differential load $R_{LOAD}$ may comprise two network termination resistors $2R_T$ (to avoid reflections) and the connected nodes. Each node contributes to the overall load with its receiver resistances $R_i$ (see also FIG. 1). A common mode choke (CMC) can be provided to reduce emissions on the bus and increase immunity against disturbances.

In order to use only a single comparator, all four comparisons may be performed subsequently, inverting the connection of the detection circuit with the network (input switches) and defining the comparison phases ph-ca and ph-cb. During the comparison phase ph-ca the reference generator 208 provides the minimum allowed voltage and the performed comparison results in $$V_{IN} > 0 \text{ if } V_{C1} - V_{C2} = |V_{TX}| < V_{MIN}.$$

In contrast, during the comparison phase ph-cb the reference generator 208 provides the maximum allowed voltage, leading to a comparison as follows:

$$V_{IN} > 0 \text{ if } V_{C1} - V_{C2} = |V_{TX}| < V_{MAX},$$

which is the opposite of the failure condition. In this case, the output 236 needs to be inverted, which is indicated by the inversion at the upper input port of the AND gate 211.

The comparator unit 209 compares the stored voltage $V_{C1}$-$V_{C2}$ with the one provided by the reference generator 208 ($V_{MIN}$ or $V_{MAX}$ depending on the comparison to be conducted). The comparator unit 209 may comprise a comparator (which is active during the phase ph-c) and a positive edge-triggered D-flip flop (driven by the positive edge of the signal clock 307), which samples and holds the comparator output 236 at the end of each comparison phase ph-c.

The AND gates 210 and 211 allow using the output of the comparison phases ph-ca and using the inverted output of the comparison phases ph-cb in order to obtain the four failure conditions.

The OR gate 212 combines the comparisons as follows:

(1) In case of Phase1 (ph1), $$V_{C1}=V_{BP}-V_{c1p} \text{ and}$$

$$V_{C2}=V_{BM}-V_{c1p},$$

wherein $V_{c1p}$ indicates the voltage at the non-inverting terminal of the comparator unit 209 during the signal Data_1.

(1.1) In case of comparison phase ph-ca, a voltage $V_{IN}$ at the input terminals of the comparator unit 209 amounts to $$V_{IN}=-V_{C1}+V_{C2}+V_{MIN1}=-V_{BP}+V_{BM}+V_{MIN1}>0,$$

which is true for $$\text{Data\_1}<V_{MIN1}.$$

The output 236 of the comparator unit 209 supplies a signal that corresponds to the failure condition Data_1<$V_{MIN}$1. This signal is conveyed unchanged via the AND gate 210 and provided in the signal Comp OUTPUT 310.

Hence, if the condition Data_1<$V_{MIN1}$ is true, the failure condition comp 1a is indicated in the signal Comp OUTPUT 310.

(1.2) In case of comparison phase ph-cb:

$$V_{IN}=-V_{C1}+V_{C2}+V_{MAX1}=-V_{BP}+V_{BM}+V_{MAX1}>0,$$

which is true for $$\text{Data\_1}<V_{MAX1}.$$

The output 236 of the comparator unit 209 is the opposite of the failure condition. Hence, the inverse signal thereof is sent to the input of the AND gate 211. If Data_1>$V_{MAX1}$, the output 236 of the comparator unit 209 indicates "0", which is inverted to "1" and fed to the AND gate 211. Hence, if the condition Data_1>$V_{MAX1}$ is true, the failure condition comp 1b is indicated in the signal Comp OUTPUT 310.

(2) In case of Phase0 (ph0):

$$V_{C1}=V_{BM}-V_{c0p} \text{ and}$$

$$V_{C2}=V_{BP}-V_{c0p},$$

wherein $V_{c0p}$ indicates the voltage at the non-inverting terminal of the comparator unit 209 during the signal Data_0.

(2.1) In case of comparison phase ph-ca:

$$V_{IN}=-V_{C1}+V_{C2}+V_{MIN0}=-V_{BM}+V_{BP}+V_{MIN0}>0,$$

which is true for $$-\text{Data\_0}<V_{MIN0}.$$

$$(-\text{Data\_0}>0 \text{ and } V_{MIN0}=-R_{MIN}\cdot i_{DM0}>0).$$

The output 236 of the comparator unit 209 supplies a signal that corresponds to the failure condition −Data_0<$V_{MIN0}$. The signal is conveyed unchanged via the AND gate 210 and provided in the signal Comp OUTPUT 310.

Hence, if the condition −Data_0<$V_{MIN0}$ is true, the failure condition comp 0a is indicated in the signal Comp OUTPUT 310.

(2.2) In case of comparison phase ph-cb:

$$V_{IN}=-V_{C1}+V_{C2}+V_{MAX0}=-V_{BM}+V_{BP}+V_{MAX0}>0,$$

which is true for $$-\text{Data\_0}<V_{MAX0}.$$

$$(-\text{Data\_0}>0 \text{ and } V_{MAX0}=-R_{MAX}\cdot i_{DM0}>0).$$

The output 236 of the comparator unit 209 is the opposite of the failure condition. Hence, the inverse signal thereof is sent to the input of the AND gate 211. If −Data_0>$V_{MAX0}$, the output 236 of the comparator unit 209 indicates "0", which is inverted to "1" and fed to the AND gate 211. Hence, if the condition −Data_0>$V_{MAX0}$ is true, the failure condition comp 0b is indicated in the signal Comp OUTPUT 310.

After each comparison (1.1), (1.2), (2.1) and (2.2), a failure may be indicated or flagged, e.g., via a logic "1" in the signal Comp OUTPUT 310, if the corresponding failure condition is fulfilled.

Advantageously, the "1" signal may be maintained as long as a subsequent comparison is being processed. This results in a stable signal; if the signal Comp OUTPUT 310 is logic "0", normal operation without any detected failure is indicated.

Figure 6:
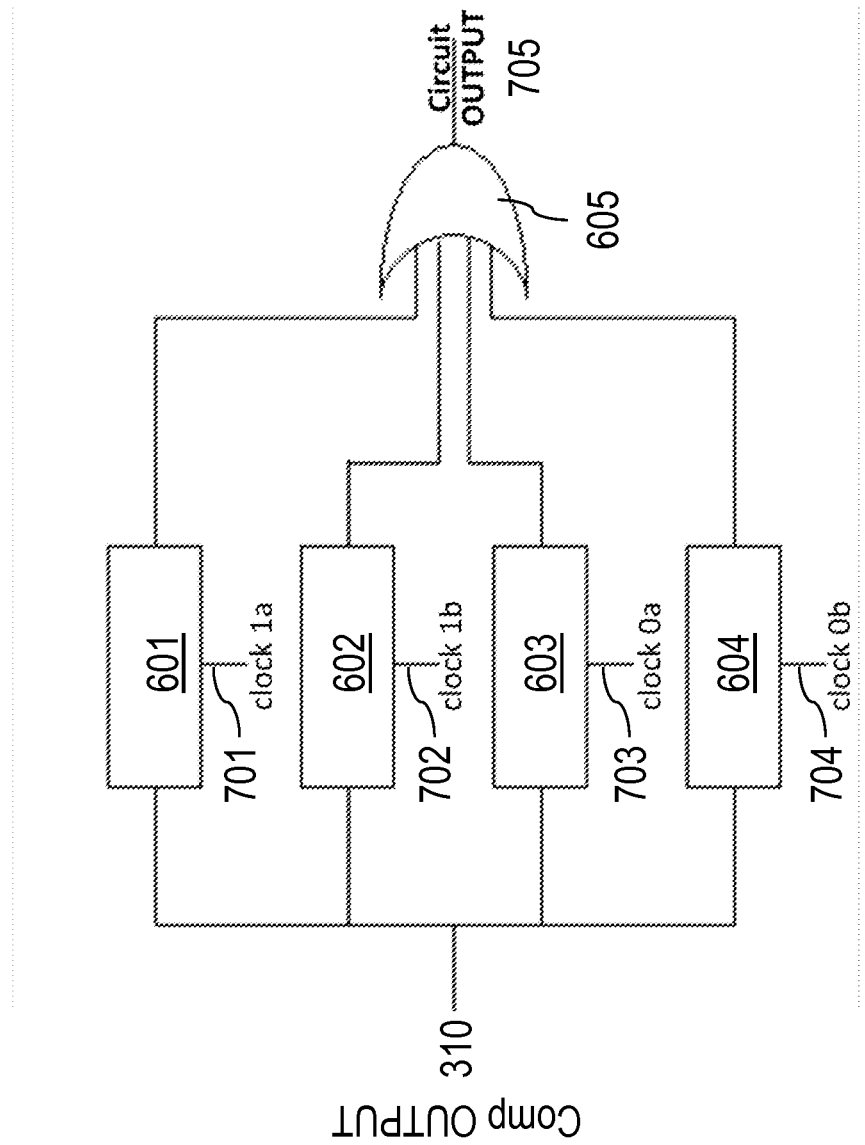
FIG. 6 shows a schematic circuit diagram processing the signal Comp OUTPUT provided by the circuit shown in FIG. 2.
Figure 7:
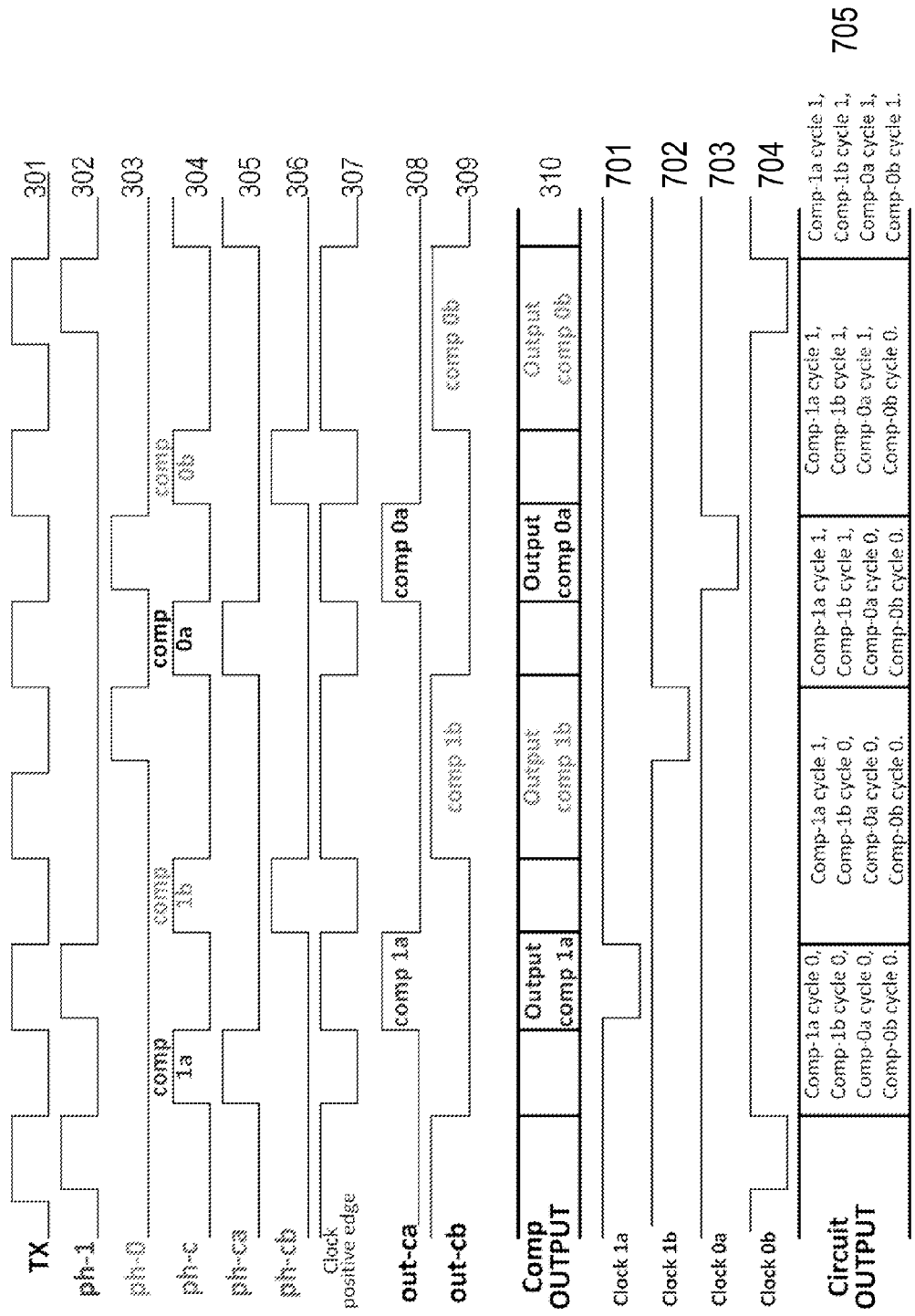
FIG. 7 shows a logic diagram comprising several signals of the schematic circuit diagram according to FIG. 2 and FIG. 6.

FIG. 6 shows a schematic circuit diagram processing the signal Comp OUTPUT 310 of the OR gate 212 in FIG. 2. This signal Comp OUTPUT 310 is conveyed to four positive edge-triggered D-flip flops 601 to 604, wherein to D-flip flop 601 a clock signal clock 1a 701, to D-flip flop 602 a clock signal clock 1b 702, to D-flip flop 603 a clock signal clock 0a 703 and to D-flip flop 604 a clock signal clock 0b 704 is conveyed. The clock signals in combination with the signals of FIG. 3 are shown in FIG. 7. The outputs of the D-flip flops 601 to 604 are each connected to an input of an OR gate 605, wherein the output of the OR gate 605 provides a signal Circuit OUTPUT 705, also visualized in FIG. 7.

Hence, to obtain the stable output signal 705 in case of a failure, a detection cycle can be used comprising the four comparisons. The four failure conditions are thus subsequently checked and the output of the comparisons available as the signal Comp OUTPUT 310 at the output of the OR gate 212 are stored using the four positive edge-triggered D-flip flops 601 to 604. The D-flip flops are controlled by the clock signals 701 to 704 such that for each comparison result only one of the four D-flip flops 601 to 604 is triggered, i.e. used for storing the signal Comp OUTPUT 310 in one D-flip flop 601 to 604 at a time. Accordingly, in a time-multiplex manner at one time only one of the comparison results is stored in one of the D-flip flops 601 to 604.

Advantageously, every comparison output may overwrite the previous value of the same comparison. Hence, the failure-state is updated at each comparison, taking in consideration all four outputs (the comparison output just processed plus the three previous comparison outputs). A failure condition is flagged as soon as a failure condition is satisfied. It persists as long as a failure condition is stored in at least one of the D-flip flops 601 to 604. As an option, the type of failure can be determined as soon as all four comparisons are available.

Reference Generator

There are several possibilities to implement the functionality provided by the reference generator 208.

Figure 8:
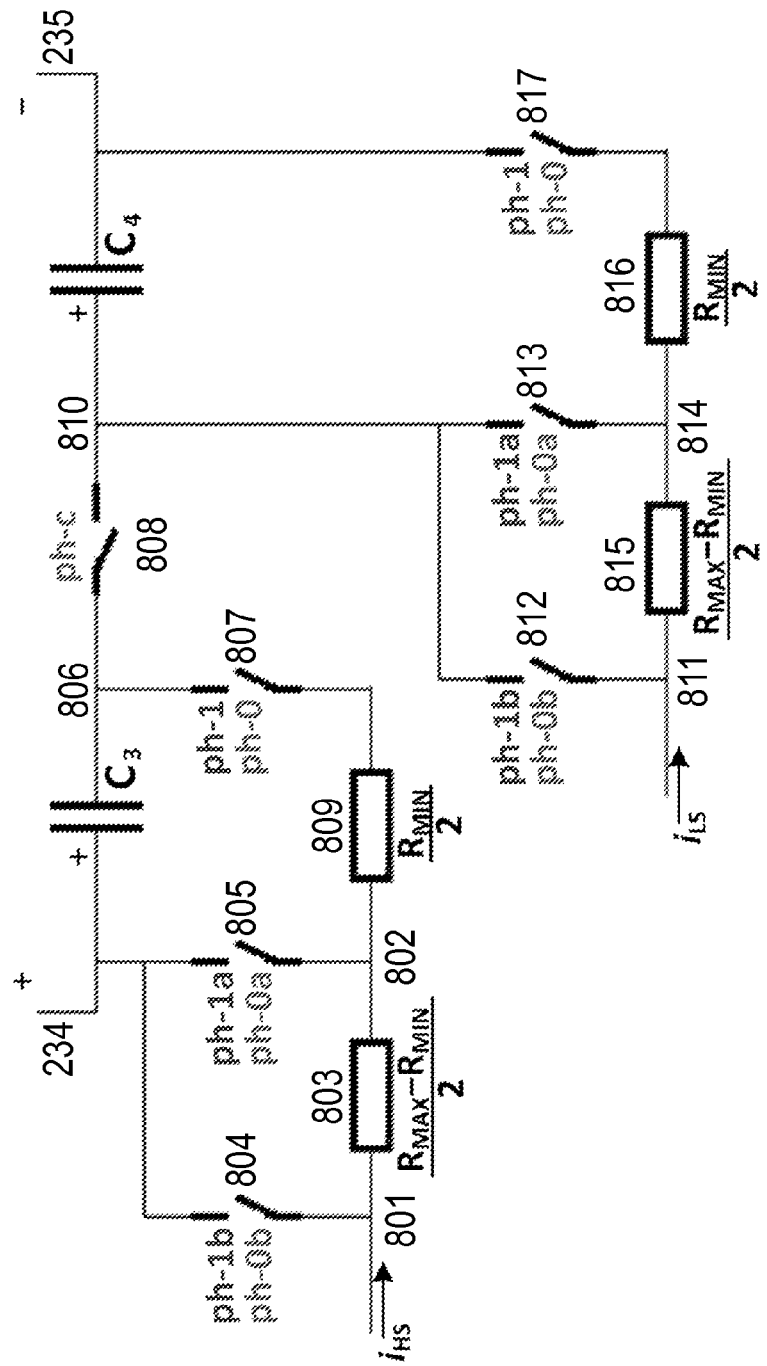
FIG. 8 shows an exemplary implementation of the reference generator in case a high side current $i_{HS}$ and a low side current $i_{LS}$ in the output stage of the transmitter can be determined.

FIG. 8 shows an exemplary implementation of the reference generator in case a high side current $i_{HS}$ and a low side current $i_{LS}$, i.e. the currents $i_{HS1}$ and $i_{LS1}$ during the Phase1 ph-1 and the currents $i_{HS0}$ and $i_{LS0}$ during the Phase0 ph-0 (see also FIG. 4 and FIG. 5 above) in the output stage of the transmitter can be determined.

The current $i_{HS}$ is fed to a node 801, the node 801 is connected via a resistor 803 to a node 802. The node 801 is connected via a switch 804 to the terminal 234. The node 802 is connected via a switch 805 to the terminal 234. The terminal 234 is connected via a capacitor C3 to a node 806. The node 802 is connected via a resistor 809, which is connected in series with a switch 807, to the node 806. The node 806 is connected via a switch 808 to a node 810.

The current $i_{LS}$ is fed to a node 811. The node 811 is connected via a switch 812 to the node 810. The node 811 is connected via a resistor 815 to a node 814. The node 814 is connected via a switch 813 to the node 810. The node 810 is connected via a capacitor C4 to the terminal 235. The node 814 is connected via a resistor 816, which is connected in series with a switch 817, to the terminal 235.

The resistors may be dimensioned as follows:

$$\text{resistors 803, 815: } \frac{R_{MAX} - R_{MIN}}{2}$$

$$\text{resistors 809, 816: } \frac{R_{MIN}}{2}$$

The switches are associated with the following phases:

| | |
|---|---|
| switch 804: | Phase1, to perform the comparison phase ph-cb (in short: ph-1b); |
| | Phase0, to perform the comparison phase ph-cb (in short: ph-0b) |
| switch 805: | Phase1, to perform the comparison phase ph-ca (in short: ph-1a); |
| | Phase0, to perform the comparison phase ph-ca (in short: ph-0a) |
| switch 807: | Phase1 (ph-1); |
| | Phase0 (ph-0) |
| switch 808: | comparison phase (ph-c) |
| switch 812: | Phase1, to perform the comparison phase ph-cb (in short: ph-1b); |
| | Phase0, to perform the comparison phase ph-cb (in short: ph-0b) |
| switch 813: | Phase1, to perform the comparison phase ph-ca (in short: ph-1a); |
| | Phase0, to perform the comparison phase ph-ca (in short: ph-0a) |
| switch 817: | Phase1 (ph-1); |
| | Phase0 (ph-0) |

It is noted that the phase ph-1b indicates that the respective switch is activated during a sub-phase of the Phase1 to generate and save the reference voltage, which will be used during the comparison phase ph-c to perform the comparison phase ph-cb. Accordingly, the phase ph-0b indicates that the respective switch is activated during a sub-phase of the Phase0 to generate and save the reference voltage, which will be used during the comparison phase ph-c to perform the comparison phase ph-cb.

The same applies accordingly for the comparison phase ph-ca.

Figure 9:
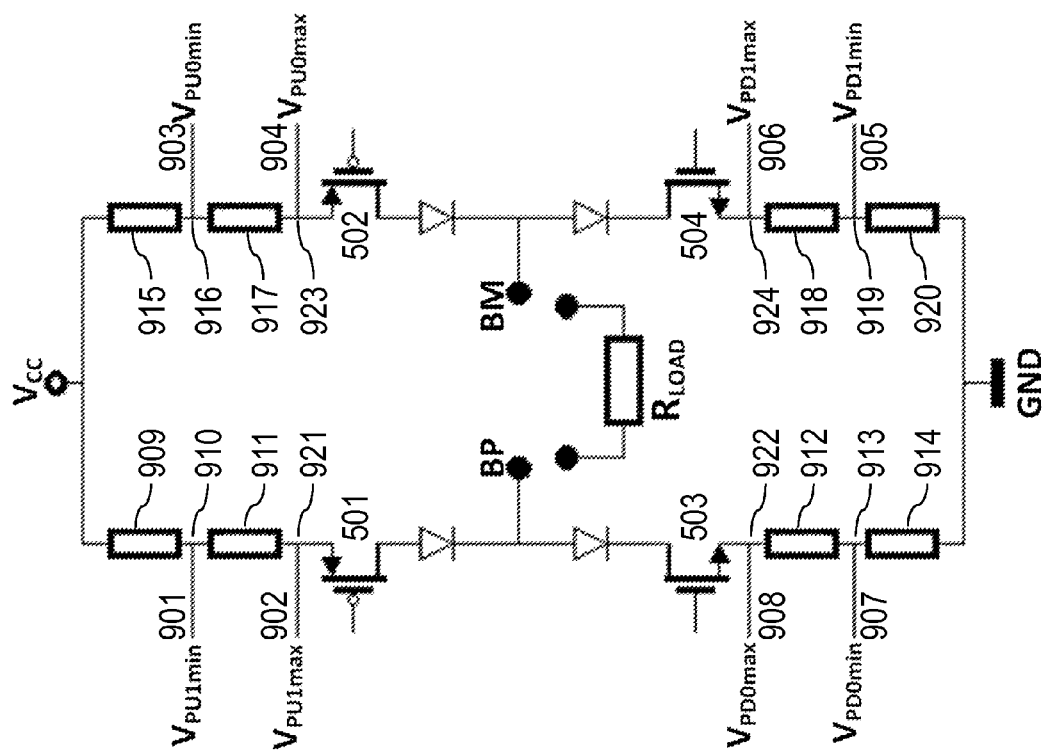
FIG. 9 shows an output stage of the transmitter based on FIG. 4 and FIG. 5, with integrated resistors $R_{MIN}$ and $R_{MAX}$ in case the high side current $i_{HS}$ and the low side current $i_{LS}$ cannot be isolated.

In case the high side current $i_{HS}$ and the low side current $i_{LS}$ in the output stage of the transmitter cannot be isolated, the resistors $R_{MIN}$ and $R_{MAX}$ can be integrated in the output stage of the transmitter as shown in FIG. 9.

The diagram of FIG. 9 is based on the diagram of FIG. 4 and FIG. 5. In contrast to these figures, in FIG. 9 the voltage source $V_{CC}$ is not directly connected to the high side switches 501 and 502 and the low side switches 503 and 504 are not directly connected to ground GND.

Instead, the voltage source $V_{CC}$ is connected via a resistor 909 to a node 910, which supplies a signal 901 $V_{PU1min}$. The node 910 is connected via a resistor 911 to a node 921, which supplies a signal 902 $V_{PU1max}$. The node 921 is connected to the source of the MOSFET 501.

Also, the voltage source $V_{CC}$ is connected via a resistor 915 to a node 916, which supplies a signal 903 $V_{PU0min}$. The node 916 is connected via a resistor 917 to a node 923, which supplies a signal 904 $V_{PU0max}$. The node 923 is connected to the source of the MOSFET 502.

The source of the MOSFET 503 is connected to a node 922, which supplies a signal 908 $V_{PD0max}$. The node 922 is connected via a resistor 912 to a node 913, which supplies a signal 907 $V_{PD0min}$. The node 913 is connected via a resistor 914 to ground GND.

The source of the MOSFET 504 is connected to a node 924, which supplies a signal 906 $V_{PD1max}$. The node 924 is connected via a resistor 918 to a node 919, which supplies a signal 905 $V_{PD1min}$. The node 919 is connected via a resistor 920 to ground GND.

The resistors may be dimensioned as follows:

$$\text{resistors 911, 917, 912, 918: } \frac{R_{MAX} - R_{MIN}}{2}$$

$$\text{resistors 909, 915, 914, 920: } \frac{R_{MIN}}{2}$$

Figure 10:
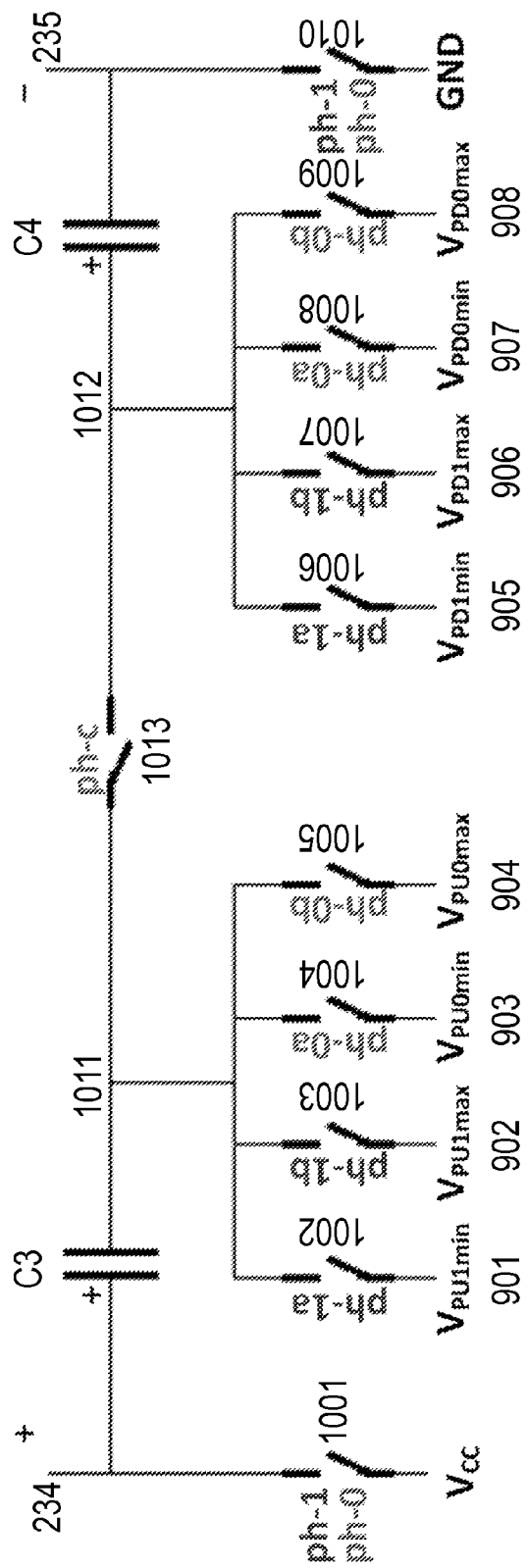
FIG. 10 shows an alternative implementation of the reference generator according to FIG. 9.

In addition, FIG. 10 shows an alternative implementation of the reference generator in accordance with FIG. 9. The supply voltage $V_{CC}$ is connected via a switch 1001 to the terminal 234. The terminal 234 is connected via a capacitor C3 to a node 1011. The node 1011 is connected via a switch 1013 to a node 1012. The node 1012 is connected via a capacitor C4 to the terminal 235. The terminal 235 is connected via a switch 1010 to ground GND.

The signal 901 is connected via a switch 1002 to the node 1011. The signal 902 is connected via a switch 1003 to the node 1011. The signal 903 is connected via a switch 1004 to the node 1011. The signal 904 is connected via a switch 1005 to the node 1011.

The signal 905 is connected via a switch 1006 to the node 1012. The signal 906 is connected via a switch 1007 to the node 1012. The signal 907 is connected via a switch 1008 to the node 1012. The signal 908 is connected via a switch 1009 to the node 1012.

In the circuits shown in FIG. 8 and FIG. 10, the reference voltage $V_{REF}$ is generated across the capacitors C3 and C4, starting from the currents flowing in the active high side ($i_{HS}$) and low side ($i_{LS}$) of the transmitter, i.e. the currents $i_{HS1}$ and $i_{LS1}$ during the Phase1 ph-1 and the currents $i_{HS0}$ and $i_{LS0}$ during the Phase0 ph-0 (see also FIG. 4 and FIG. 5 above).

The switches are associated with the following phases:

| | |
|---|---|
| switch 1001: | Phase1 (ph-1); |
| | Phase0 (ph-0) |
| switch 1002: | Phase1, to perform the comparison phase ph-ca (in short: ph-1a) |
| switch 1003: | Phase1, to perform the comparison phase ph-cb (in short: ph-1b) |
| switch 1004: | Phase0, to perform the comparison phase ph-ca (in short: ph-0a) |
| switch 1005: | Phase0, to perform the comparison phase ph-cb (in short: ph-0b) |
| switch 1006: | Phase1, to perform the comparison phase ph-ca (in short: ph-1a) |
| switch 1007: | Phase1, to perform the comparison phase ph-cb (in short: ph-1b) |
| switch 1008: | Phase0, to perform the comparison phase ph-ca (in short: ph-0a) |
| switch 1009: | Phase0, to perform the comparison phase ph-cb (in short: ph-0b) |
| switch 1010: | Phase1 (ph-1); |
| | Phase0 (ph-0) |
| switch 1013: | comparison phase (ph-c) |

Figure 11:
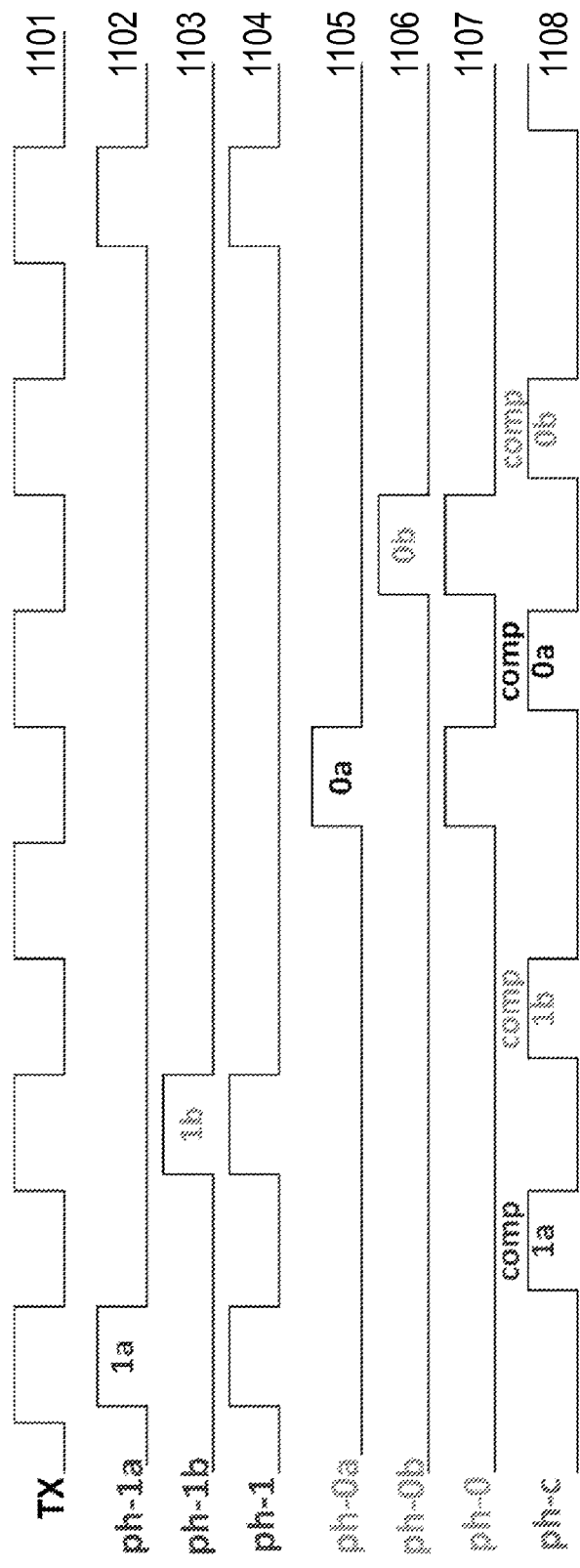
FIG. 11 shows a logic diagram comprising several signals of the schematic diagram according to FIG. 8 and FIG. 10.

FIG. 11 shows a logic diagram comprising several signals of the schematic diagram according to FIG. 8 and FIG. 10.

A transmission signal TX 1101 is exemplarily taken as a basis for generating the subsequent signals. In addition, FIG. 11 shows the following signals:
- signal of Phase1, to perform the comparison phase ph-ca denoted as signal ph-1a 1102;
- signal of Phase1, to perform the comparison phase ph-cb denoted as signal ph-1b 1103;
- signal of Phase1 ph-1 1104;
- signal of Phase0, to perform the comparison phase ph-ca denoted as signal ph-0a 1105;
- signal of Phase0, to perform the comparison phase ph-cb denoted as signal ph-0b 1106;
- signal of Phase0 ph-0 1107;
- signal of comparison phase ph-c 1108.

Behavior of Comparisons:

(1) First Comparison "comp 1a" for Data_1

$$\text{Data\_1} < V_{MIN1}$$

(1.1) The switches associated with the phases ph-1a and ph1 are closed, the switches associated with the phases ph-1b, ph-0 (also ph-0a and ph-0b) and ph-c are open.

(a) The signal Data_1 is saved across the capacitors C1 and C2:

$$V_{C1} = V_{BP1} - V_{c1p}, V_{C2} = V_{BM1} - V_{c1p} \rightarrow V_{C1} - V_{C2} = V_{BP1} - V_{BM1} = \text{Data\_1}$$

(b) The reference voltage $V_{MIN1}$ is saved across the capacitors C3 and C4:

$$V_{C3} = \frac{R_{MIN}}{2} i_{HS1}$$

$$V_{C4} = \frac{R_{MIN}}{2} i_{LS1}$$

$$\rightarrow V_{C3} + V_{C4} = R_{MIN}\left(\frac{i_{HS1} + i_{LS1}}{2}\right) = R_{MIN} i_{DM1} = V_{MIN1}$$

(1.2) The switches associated with the phase ph-c are closed, the switches associated with the phases ph-1 and ph-0 (also ph-1a, ph-1b, ph-0a and ph-0b) are open, the comparator unit 209 is active.

The voltages are compared:

$$V_{IN} = -V_{C1} + V_{C2} + V_{C3} + V_{C4} = -\text{Data\_1} + V_{MIN1} \rightarrow V_{IN} > 0 \rightarrow \text{Data\_1} < V_{MIN1}$$

(1.3) The signal out-ca is "1" at the input of the AND gate 210 and the signal out-cb is "O" at the input of the AND gate 211 (see FIG. 2). The output signal Comp OUTPUT 310 is "1" in case the following condition is fulfilled:

$$\text{Data\_1} < V_{MIN1}$$

(2) Second Comparison "comp 1b" for Data_1:

$$\text{Data\_1} > V_{MAX1}$$

(2.1) The switches associated with the phases ph-1b and ph1 are closed, the switches associated with the phases ph-1a, ph-0 (also ph-0a and ph-0b) and ph-c are open.

(a) Data_1 is saved across the capacitors C1 and C2:

$$V_{C1} = V_{BP1} - V_{c1p}, V_{C2} = V_{BM1} - V_{c1p} \rightarrow V_{C1} - V_{C2} = V_{BP1} - V_{BM1} = \text{Data\_1}$$

(b) The reference voltage $V_{MAX1}$ is saved across the capacitors C3 and C4:

$$V_{C3} = \frac{R_{MAX}}{2} i_{HS1}$$

$$V_{C4} = \frac{R_{MAX}}{2} i_{LS1}$$

$$\rightarrow V_{C3} + V_{C4} = R_{MAX}\left(\frac{i_{HS1} + i_{LS1}}{2}\right) = R_{MAX} i_{DM1} = V_{MAX1}$$

(2.2) The switches associated with the phase ph-c are closed, the switches associated with the phases ph-1 and ph-0 (also ph-1a, ph-1b, ph-0a and ph-0b) are open, the comparator unit 209 is active.

The voltages are compared:

$$V_{IN} = -V_{C1} + V_{C2} + V_{C3} + V_{C4} = -\text{Data\_1} + V_{MAX1} \rightarrow V_{IN} > 0 \rightarrow \text{Data\_1} < V_{MAX1}$$

(2.3) The signal out-cb is "1" and the signal out-ca is "0". The output signal Comp OUTPUT 310 is "1" in case the following condition is fulfilled:

$$\text{Data\_1} > V_{MAX1}$$

(3) Third Comparison "comp 0a" for Data_0:

$$-\text{Data\_0} < V_{MIN0}$$

(3.1) The switches associated with the phases ph-0a and ph0 are closed, the switches associated with the phases ph-0b, ph-1 (also ph-1a and ph-1b) and ph-c are open.

(a) The signal Data_0 is saved across the capacitors C1 and C2:

$$V_{C1} = V_{BM0} - V_{c0p}, V_{C2} = V_{BP0} - V_{c0p} \rightarrow V_{C2} - V_{C1} = V_{BP0} - V_{BM0} = \text{Data\_0}$$

(b) The reference voltage $V_{MIN0}$ is saved across the capacitors C3 and C4:

$$V_{C3} = \frac{R_{MIN}}{2} i_{HS0}$$

$$V_{C4} = \frac{R_{MIN}}{2} i_{LS0}$$

$$\rightarrow V_{C3} + V_{C4} = R_{MIN}\left(\frac{i_{HS0} + i_{LS0}}{2}\right) = -R_{MIN} i_{DM0} = V_{MIN0}$$

(3.2) The switches associated with the phase ph-c are closed, the switches associated with the phases ph-1 and ph-0 (also ph-1a, ph-1b, ph-0a and ph-0b) are open, the comparator unit 209 is active.

The voltages are compared:

$$V_{IN} = -V_{C1} + V_{C2} + V_{C3} + V_{C4} = \text{Data\_0} + V_{MIN0} \rightarrow V_{IN} > 0 \rightarrow -\text{Data\_0} < V_{MIN0}$$

(3.3) The signal out-ca is "1" and the signal out-cb is "0". The output signal Comp OUTPUT 310 is "1" in case the following condition is fulfilled:

$$-\text{Data\_0} < V_{MIN0}$$

(4) Fourth Comparison "comp 0b" for Data_0:

$$-\text{Data\_0} > V_{MAX0}$$

(4.1) The switches associated with the phases ph-0b and ph0 are closed, the switches associated with the phases ph-0a, ph-1 (also ph-1a and ph-1b) and ph-c are open.

(a) The signal Data_0 is saved across the capacitors C1 and C2:

$$V_{C1}=V_{BM0}-V_{c0p}\ V_{C2}=V_{BP0}-V_{c0p} \rightarrow V_{C2}-V_{C1}=V_{BP0}-V_{BM0}=\text{Data\_0}$$

(b) The reference voltage $V_{MAX0}$ is saved across the capacitors C3 and C4:

$$V_{C3} = \frac{R_{MAX}}{2} i_{HS0}$$

$$V_{C4} = \frac{R_{MAX}}{2} i_{LS0}$$

$$\rightarrow V_{C3} + V_{C4} = R_{MAX}\left(\frac{i_{HS0}+i_{LS0}}{2}\right) = -R_{MAX} i_{DM0} = V_{MAX0}$$

(4.2) The switches associated with the phase ph-c are closed, the switches associated with the phases ph-1 and ph-0 (also ph-1a, ph-1b, ph-0a and ph-0b) are open, the comparator unit 209 is active.
The voltages are compared:

$$V_{IN}=-V_{C1}+V_{C2}+V_{C3}+V_{C4}=\text{Data\_0}+V_{MAX0} \rightarrow V_{IN}>0 \rightarrow -\text{Data\_0}<V_{MAX0}$$

(4.3) The signal out-cb is "1" and the signal out-ca is "0". The output signal Comp OUTPUT 310 is "1" in case the following condition is fulfilled:

$$-\text{Data\_0}>V_{MAX0}$$

Figure 12:
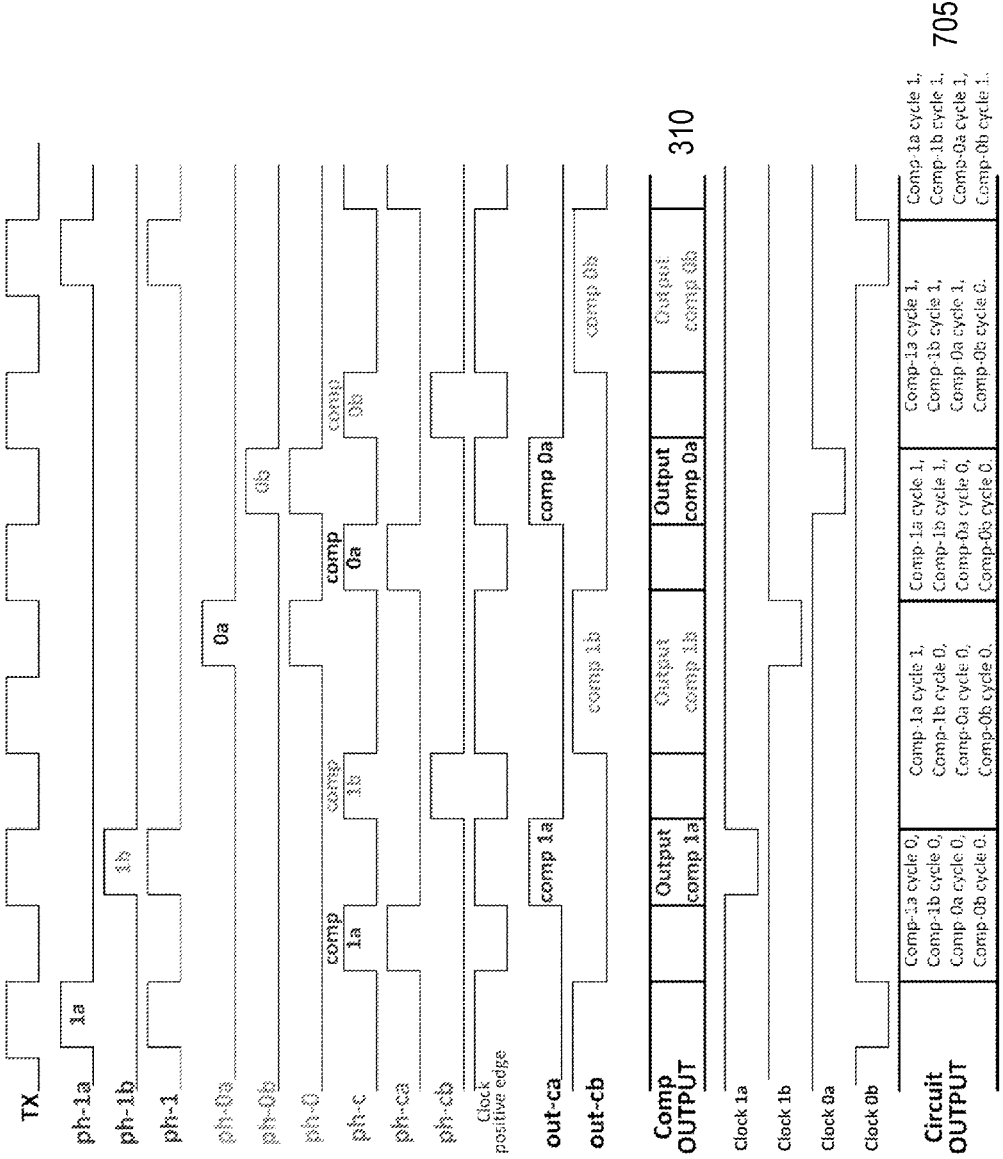
FIG. 12 shows a logic diagram comprising several signals based on the circuitry shown in FIG. 2 and FIG. 6, wherein the reference generator may be implemented according to the circuitry shown in FIG. 8 or FIG. 10.

FIG. 12 shows a logic diagram comprising several signals that may be based on a transmission signal TX, which is exemplarily taken as a basis for generating the subsequent signals. The underlying circuitry comprises the arrangement according to FIG. 2 and FIG. 6, wherein the reference generator 208 may be implemented according to the circuitry shown in FIG. 8 or FIG. 10.

FIG. 12 comprises the transmission signal TX, the signal of the phases ph-1a, ph-1b, ph-1, ph-0a, ph-0b, ph-0, ph-c, ph-ca and ph-cb. The phases are associated with switches as explained and shown above. Also, a clock positive edge signal is shown that is applied to the comparator unit 209. The signals out-ca and out-cb applied to the gates 210 and 211 are shown as well as the Comp OUTPUT signal 310 and the clock signals applied to the D-flip flops 601 to 604 resulting in a Circuit OUTPUT signal 705.

Figure 13:
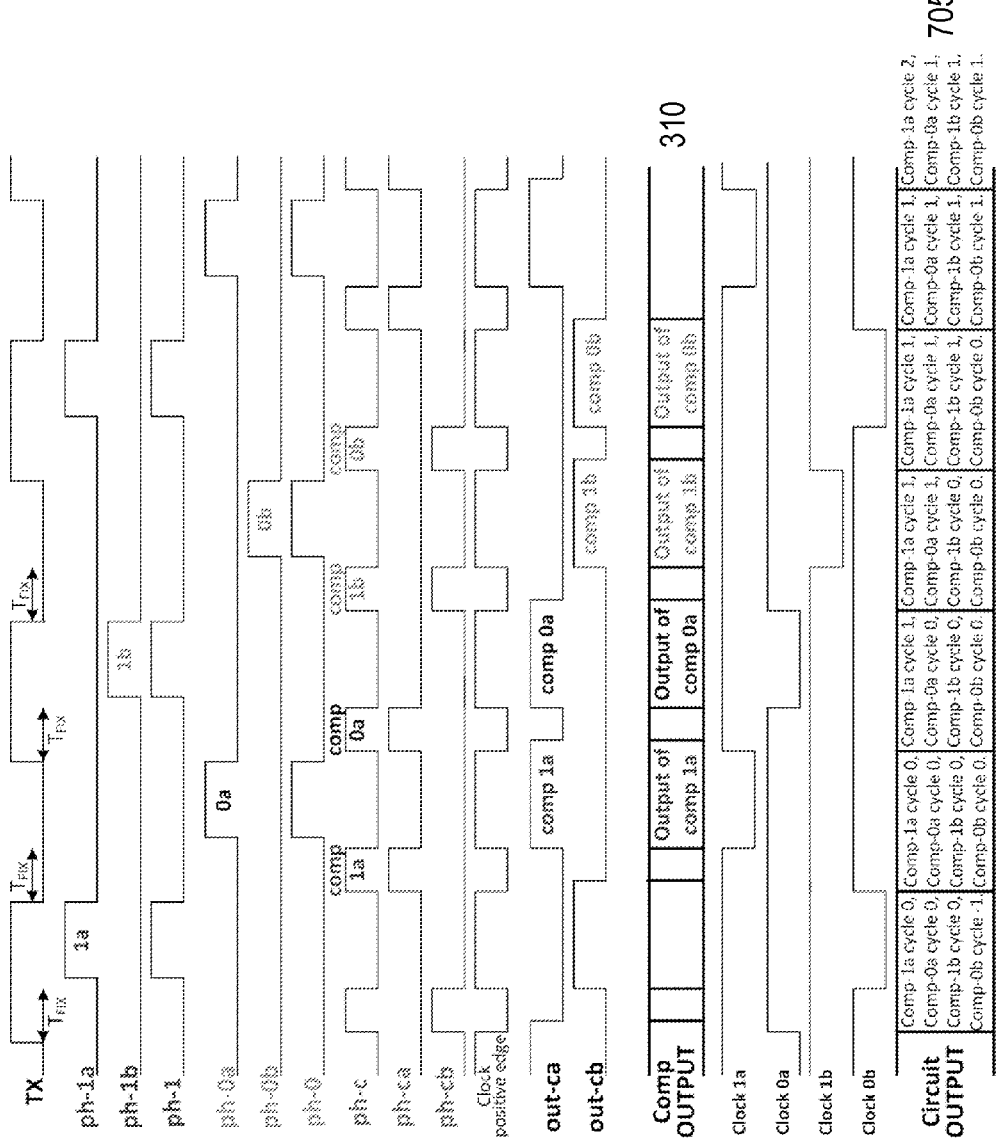
FIG. 13 shows a logic diagram comprising several signals based on the circuitry shown in FIG. 2 and FIG. 6, wherein the reference generator may be implemented according to the circuitry shown in FIG. 8 or FIG. 10 illustrating how faster results at the Circuit OUTPUT signal can be achieved by utilizing a fixed delay $T_{FIX}$.

FIG. 13 shows a logic diagram comprising several signals based on the circuitry shown in FIG. 2 and FIG. 6 providing faster results at the Circuit OUTPUT signal 705 by utilizing a fixed delay $T_{FIX}$. The delay $T_{FIX}$ is preferably constant and large enough to perform the comparison (the extension of ph-c is $T_{FIX}$) but small enough to allow a correct value to be stored in the capacitors C1 and C2. The smallest bit length may be considered for defining or configuring the delay $T_{FIX}$.

FIG. 14 shows an exemplary table summarizing several failure types in relation to the fulfilled (or not fulfilled) failure conditions (comparisons). A row 1401 indicates the failure type of at least one broken bus wire. A row 1402 indicates the failure type of the bus wires being short circuited with each other. A row 1403 indicates the failure type of the positive bus wire BP connected to ground or the negative bus wire BM connected either to the supply voltage $V_{CC}$ or to the battery voltage $V_{BAT}$. A row 1404 indicates the failure type of the positive bus wire BP connected either to the supply voltage $V_{CC}$ or to the battery voltage $V_{BAT}$ or the negative bus wire BM connected to ground.

A column 1405 indicates the comparison comp 1a for the signal Data_1, a column 1406 indicates the comparison comp 1b for the signal Data_1, a column 1407 indicates the comparison comp 0a for the signal Data_0 and a column 1408 indicates the comparison comp 0b for the signal Data_0.

The table of FIG. 14 shows the dependencies between the failure types and the comparisons, wherein "y" indicates that a comparison is true and "n" indicates that a comparison is not true. Hence, based on the combinations of "y" and "n" per row, the respective failure type can be identified.

Further Advantages

This approach allows detection of an increasing number of failure types. In particular, one short circuited bus wire, a broken wire, broken wires and bus wires that are short circuited with each other can be detected.

Further, the approach improves detection performance also of the case of one short circuited bus wire, both in static and dynamic mode.

Also, the approach allows identifying the failure type via satisfied failure conditions.

Yet, the approach is applicable independently from the output characteristic of the transmitter. The DM currents for deriving the allowed DM voltage ranges may be measured and do not have to be calculated.

Hence, the network reliability can be significantly improved. The approach may be applicable independently from a transmitter's output characteristics.

The examples suggested herein may in particular be based on at least one of the following solutions. In particular combinations of the following features could be utilized in order to reach a desired result. The features of the method could be combined with any feature(s) of the device or system or vice versa.

A method for detecting a failure on a differential bus is presented comprising the steps:
  determining an allowed voltage range of the differential bus based on a minimum load and a maximum load;
  comparing a differential bus voltage with the allowed voltage range;
  determining a failure state in case the differential bus voltage is outside the allowed voltage range.

It is noted that the minimum load is regarded as a first or low threshold for a load and the maximum load is regarded as a second or high threshold for a load that may be admissible, beneficial or suitable for the differential bus. The maximum load and the minimum load can be set or configured according to particular requirements, specifications or use case scenarios. Both terms "minimum" and "maximum" in this context could hence also be understood as "low" and "high" values for a load (on the differential bus).

In an embodiment, the method comprises the step:
  determining the allowed voltage range of the differential bus based on at least one measured differential mode current.

In an embodiment, comparing a differential bus voltage with the allowed voltage range comprises the steps:
  for a first signal conducting comparisons based on the minimum load and the maximum load;
  for a second signal conducting comparisons based on the minimum load and the maximum load.

The first signal may be the signal referred to as Data_1 and the second signal may be the signal referred to as Data_0.

The solution presented in particular allows comparing a differential mode voltage on a bus (also referred to as DM bus voltage) during a signal "Data_1" (VTX1) and/or a signal "Data_0" (VTX0), in particular with an allowed DM bus voltage range, e.g., defined starting from the DM current flowing in the considered transceiver. Data_1 may indicate a signal corresponding to logic "1" and Data_0 may indicate a signal corresponding to logic "0". Both, Data_0 and Data_1 are differential signals that may be used to encode a single bit of information on a differential bus system.

In an embodiment, the first signal and the second signal are differential signals between two bus lines of the differential bus.

In an embodiment, the comparisons for the first signal comprise:

$$R_{MIN} i_{DM1} < V_{TX1} < R_{MAX} i_{DM1}$$

with
- $i_{DM1}$ being a differential mode current during the first signal;
- $R_{MIN}$ being the minimum load;
- $R_{MAX}$ being the maximum load; and
- $V_{TX1}$ being the allowed voltage range for the first signal.

In an embodiment, the comparisons for the second signal comprise:

$$R_{MAX} i_{DM0} < V_{TX0} < R_{MIN} i_{DM0}$$

with
- $i_{DM0}$ being a differential mode negative current during the second signal;
- $R_{MIN}$ being the minimum load;
- $R_{MAX}$ being the maximum load; and
- $V_{TX0}$ being the allowed negative voltage range for the second signal.

In an embodiment, the failure state is based on several comparisons for the first signal and for the second signal.

In an embodiment, the comparisons comprise:
(a) for the first signal:

$$V_{TX1} < R_{MIN} i_{DM1}$$

(b) for the first signal:

$$V_{TX1} > R_{MAX} i_{DM1}$$

(c) for the second signal:

$$|V_{TX0}| < R_{MIN} |i_{DM0}|$$

(d) for the second signal:

$$|V_{TX0}| > R_{MAX} |i_{DM0}|$$

with
- $i_{DM1}$ being a differential mode current during the first signal;
- $i_{DM0}$ being a differential mode current during the second signal;
- $R_{MIN}$ being the minimum load;
- $R_{MAX}$ being the maximum load;
- $V_{TX1}$ being the differential mode bus voltage for the first signal;
- $V_{TX0}$ being the differential mode bus voltage for the second signal.

In an embodiment, the method comprises the step of:
iteratively applying a cycle of comparisons, wherein the cycle of comparisons comprises the comparisons (a) to (d).

It is noted that the order of the comparisons conducted within such cycle may be different from the succession (a), (b), (c) and (d). For example, a different order of comparisons (d), (b), (a) and (c) could be used.

In an embodiment, the method comprises the step of:
detecting at least one broken wire of the differential bus in case the comparisons (b) and (d) are true and the comparisons (a) and (c) are false.

A comparison is deemed true in case the condition determined by the comparison is fulfilled or satisfied. Accordingly, the comparison is deemed false in case the condition determined by the comparison is not fulfilled or not satisfied.

In an embodiment, the method comprises the step of:
detecting a short circuit between bus wires in case the comparisons (a) and (c) are true and the comparisons (b) and (d) are false.

In an embodiment, the method comprises the step of:
detecting a connection of the positive bus wire to ground or of the negative bus wire either to the supply voltage $V_{CC}$ or to the battery voltage $V_{BAT}$ in case one of the following combination applies:
- the comparisons (a) and (d) are true and the comparisons (b) and (c) are false;
- the comparison (d) is true and the comparisons (a), (b) and (c) are false;
- the comparison (a) is true and the comparisons (b), (c) and (d) are false.

In an embodiment, the method comprises the step of:
detecting a connection of the positive bus wire either to the supply voltage $V_{CC}$ or to the battery voltage $V_{BAT}$ or of the negative bus wire to ground in case one of the following combination applies:
- the comparisons (b) and (c) are true and the comparisons (a) and (d) are false;
- the comparison (c) is true and the comparisons (a), (b) and (d) are false;
- the comparison (b) is true and the comparisons (a), (c) and (d) are false.

In an embodiment, the minimum load is based on a fraction of a minimum load allowed on the differential bus and wherein the maximum load is based on a fraction of the maximum load allowed on the differential bus.

In an embodiment, the minimum load and the maximum load are set according to a specification of the differential bus system.

In an embodiment, comparing the differential bus voltage with the allowed voltage range is performed simultaneously or subsequently.

In an embodiment, the method comprises at least one of the following steps after the failure state is detected:
- providing information about the type of failure;
- issue an alarm notification;
- change state of a circuitry, device or system;
- enter a safe state;
- power down;
- initiate a maintenance action.

In an embodiment, the differential bus is operated pursuant to a FlexRay protocol.

In an embodiment, the differential bus comprises a CAN bus.

A device for detecting a failure on a differential bus is suggested, wherein said device comprises a processing unit arranged for
- determining an allowed voltage range of the differential bus based on a minimum load and a maximum load;
- comparing a differential bus voltage with the allowed voltage range;
- determining a failure state in case the differential bus voltage is outside the allowed voltage range.

In an embodiment, the processing unit is arranged for conducting at least one of the following measures after a failure state is determined:
- providing information about the type of failure;
- issue an alarm notification;
- change state of a circuitry, device or system;

enter a safe state;
power down;
initiate a maintenance action.

A device for detecting a failure on a differential bus is provided, said device comprising
  means for determining an allowed voltage range of the differential bus based on a minimum load and a maximum load;
  means for comparing a differential bus voltage with the allowed voltage range;
  means for determining a failure state in case the differential bus voltage is outside the allowed voltage range.

A circuitry for detecting a failure on a differential bus is provided, the differential bus comprising a first bus wire and a second bus wire, comprising:
  a memory for storing a differential bus voltage between the first bus wire and the second bus wire,
  a unit that provides an allowed voltage range based on a minimum load and based on a maximum load,
  a comparator unit for comparing the differential bus voltage stored in the memory with the allowed voltage range,
  a switching unit for
    connecting during a loading phase the bus wires to the memory;
    connecting during a comparison phase the memory and the unit that provides the allowed voltage range to the comparator unit,
  wherein the comparator unit detects the failure in case the differential bus voltage is outside the allowed voltage range.

The comparator unit may not detect a failure in case the voltage is within the allowed voltage range.

In an embodiment, the memory comprises at least one capacitor.

In an embodiment, the switching unit is arranged to disconnect the bus wires from the memory during the comparison phase.

In an embodiment, the loading phase comprises
  a first loading phase wherein the bus wires are connected to the memory in a first polarity; and
  a second loading phase wherein the bus wires are connected to the memory in the inverse polarity.

In an embodiment, the memory comprises two memory units, which are connectable together at one end and their remaining ends are each connectable to one of the bus wires.

In an embodiment, the switching unit is arranged for connecting
  either the first bus wire with a first node and the second bus wire with a second node or
  the first bus wire with the second node and the second bus wire with the first node, and
  the first node is connected to one remaining end of the memory units and the second node is connected to the other remaining end of the memory units.

Each of the memory units may in particular comprise at least one capacitor.

In an embodiment, the circuitry comprises a sample-hold stage to maintain the output of the comparator unit for a predetermined amount of time or until the next comparison result is available.

A system is suggested comprising at least one device as described herein.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A method for detecting a failure on a differential bus, comprising:
  determining an allowed voltage range of the differential bus based on a minimum load and a maximum load;
  comparing a differential bus voltage with the allowed voltage range;
  determining a failure state in case the differential bus voltage is outside the allowed voltage range.

2. The method according to claim 1, further comprising:
  determining the allowed voltage range of the differential bus based on at least one measured differential mode current.

3. The method according to claim 1, wherein comparing a differential bus voltage with the allowed voltage range includes:
  for a first signal conducting comparisons based on the minimum load and the maximum load;
  for a second signal conducting comparisons based on the minimum load and the maximum load.

4. The method according to claim 3, wherein the first signal and the second signal are differential signals between two bus lines of the differential bus.

5. The method according to claim 3, wherein the comparisons for the first signal comprise:

$$R_{MIN} \cdot i_{DM1} < V_{TX1} < R_{MAX} \cdot i_{DM1}$$

with
  $i_{DM1}$ being a differential mode current during the first signal;
  $R_{MIN}$ being the minimum load;
  $R_{MAX}$ being the maximum load; and
  $V_{TX1}$ being the allowed voltage range for the first signal.

6. The method according to claim 3, wherein the comparisons for the second signal comprise:

$$R_{MAX} \cdot i_{DM0} < V_{TX0} < R_{MIN} \cdot i_{DM0}$$

with
  $i_{DM0}$ being a differential mode negative current during the second signal;
  $R_{MIN}$ being the minimum load;
  $R_{MAX}$ being the maximum load; and
  $V_{TX0}$ being the allowed negative voltage range for the second signal.

7. The method according to claim 3, wherein the failure state is based on several comparisons for the first signal and for the second signal.

8. The method according to claim 3, wherein the comparisons comprise:
  (a) for the first signal:

$$V_{TX1} < R_{MIN} \cdot i_{DM1}$$

(b) for the first signal:

$$V_{TX1} > R_{MAX} \cdot i_{DM1}$$

(c) for the second signal:

$$|V_{TX0}| < R_{MIN} \cdot |i_{DM0}|$$

(d) for the second signal:

$$|V_{TX0}| > R_{MAX} \cdot |i_{DM0}|$$

with
- $i_{DM1}$ being a differential mode current during the first signal;
- $i_{DM0}$ being a differential mode current during the second signal;
- $R_{MIN}$ being the minimum load;
- $R_{MAX}$ being the maximum load;
- $V_{TX1}$ being the differential mode bus voltage for the first signal;
- $V_{TX0}$ being the differential mode bus voltage for the second signal.

9. The method according to claim 8, comprising:
iteratively applying a cycle of comparisons, wherein the cycle of comparisons comprises the comparisons (a) to (d).

10. The method according to claim 8, comprising:
detecting at least one broken wire of the differential bus in case the comparisons (b) and (d) are true and the comparisons (a) and (c) are false.

11. The method according to claim 8, comprising:
detecting a short circuit between bus wires in case the comparisons (a) and (c) are true and the comparisons (b) and (d) are false.

12. The method according to claim 8, comprising:
detecting a connection of the positive bus wire to ground or of the negative bus wire either to the supply voltage $V_{CC}$ or to the battery voltage $V_{BAT}$ in case one of the following combination applies:
- the comparisons (a) and (d) are true and the comparisons (b) and (c) are false;
- the comparison (d) is true and the comparisons (a), (b) and (c) are false;
- the comparison (a) is true and the comparisons (b), (c) and (d) are false.

13. The method according to claim 8, comprising:
detecting a connection of the positive bus wire either to the supply voltage $V_{CC}$ or to the battery voltage $V_{BAT}$ or of the negative bus wire to ground in case one of the following combination applies:
- the comparisons (b) and (c) are true and the comparisons (a) and (d) are false;
- the comparison (c) is true and the comparisons (a), (b) and (d) are false;
- the comparison (b) is true and the comparisons (a), (c) and (d) are false.

14. The method according to claim 1, wherein the minimum load is based on a fraction of a minimum load allowed on the differential bus and wherein the maximum load is based on a fraction of the maximum load allowed on the differential bus.

15. The method according to claim 1, wherein the minimum load and the maximum load are set according to a specification of the differential bus system.

16. The method according to claim 1, wherein comparing the differential bus voltage with the allowed voltage range is performed simultaneously or subsequently.

17. The method according to claim 1, comprising at least one of the following after the failure state is detected:
- providing information about the type of failure;
- issue an alarm notification;
- change state of a circuitry, device or system;
- enter a safe state;
- power down;
- initiate a maintenance action.

18. The method according to claim 1, wherein the differential bus is operated pursuant to a FlexRay protocol.

19. The method according to claim 1, wherein the differential bus comprises a CAN bus.

20. A device for detecting a failure on a differential bus, wherein said device comprises a processing unit to:
- determine an allowed voltage range of the differential bus based on a minimum load and a maximum load;
- compare a differential bus voltage with the allowed voltage range;
- determine a failure state in case the differential bus voltage is outside the allowed voltage range.

21. The device according to claim 20, wherein the processing unit is arranged to perform at least one of the following measures after a failure state is determined:
- providing information about the type of failure;
- issue an alarm notification;
- change state of a circuitry, device or system;
- enter a safe state;
- power down;
- initiate a maintenance action.

22. A device for detecting a failure on a differential bus, said device comprising:
- means for determining an allowed voltage range of the differential bus based on a minimum load and a maximum load;
- means for comparing a differential bus voltage with the allowed voltage range;
- means for determining a failure state in case the differential bus voltage is outside the allowed voltage range.

23. A circuitry for detecting a failure on a differential bus, the differential bus comprising a first bus wire and a second bus wire, comprising:
- a memory for storing a differential bus voltage between the first bus wire and the second bus wire,
- a unit that provides an allowed voltage range based on a minimum load and based on a maximum load,
- a comparator unit for comparing the differential bus voltage stored in the memory with the allowed voltage range,
- a switching unit to
  - connect during a loading phase the bus wires to the memory;
  - connect during a comparison phase the memory and the unit that provides
  - the allowed voltage range to the comparator unit,
- wherein the comparator unit detects the failure in case the differential bus voltage is outside the allowed voltage range.

24. The circuitry according to claim 23, wherein the memory comprises at least one capacitor.

25. The circuitry according to claim 23, wherein the switching unit is to disconnect the bus wires from the memory during the comparison phase.

26. The circuitry according to claim 23, wherein the loading phase comprises
- a first loading phase wherein the bus wires are connected to the memory in a first polarity; and
- a second loading phase wherein the bus wires are connected to the memory in the inverse polarity.

27. The circuitry according to claim 23, wherein the memory comprises two memory units, which are connectable together at one end and their remaining ends are each connectable to one of the bus wires.

28. The circuitry according to claim 27,
wherein the switching unit is arranged to connect
either the first bus wire with a first node and the second bus wire with a second node, or
the first bus wire with the second node and the second bus wire with the first node,
wherein the first node is connected to one remaining end of the memory units and the second node is connected to the other remaining end of the memory units.

29. The circuitry according to claim 23, comprising a sample-hold stage to maintain the output of the comparator unit for a predetermined amount of time or until the next comparison result is available.

30. A system comprising at least one device according to claim 23.

* * * * *